(12) United States Patent
Shih et al.

(10) Patent No.: US 8,572,542 B2
(45) Date of Patent: Oct. 29, 2013

(54) CLOCK-TREE STRUCTURE AND METHOD FOR SYNTHESIZING THE SAME

(75) Inventors: Xin-Wei Shih, Taipei (TW); Yao-Wen Chang, Taipei (TW)

(73) Assignee: National Taiwan University, Taipei (TW)

( * ) Notice: Subject to any disclaimer, the term of this patent is extended or adjusted under 35 U.S.C. 154(b) by 68 days.

(21) Appl. No.: 13/160,847

(22) Filed: Jun. 15, 2011

(65) Prior Publication Data
US 2012/0110538 A1 May 3, 2012

(30) Foreign Application Priority Data

Oct. 28, 2010 (TW) .............................. 99136896 A (51) Int. Cl.
G06F 17/50 (2006.01)
(52) U.S. Cl.
USPC .......................................... 716/123; 716/122
(58) Field of Classification Search
USPC .................................................. 716/118–125
See application file for complete search history.

(56) References Cited

U.S. PATENT DOCUMENTS

| | | | |
|---|---|---|---|
| 7,759,973 B1 * | 7/2010 | Vadi et al. ........................ | 326/41 |
| 2003/0212971 A1 * | 11/2003 | Rodgers et al. .................... | 716/6 |
| 2007/0033560 A1 * | 2/2007 | Johnston ........................... | 716/6 |

OTHER PUBLICATIONS

Shih et al., "Fast Timing-Model Independent Buffered Clock-Tree Synthesis", Graduate Institute of Electronics Engineering, National Taiwan University (Published Jun. 15, 2010).

* cited by examiner

*Primary Examiner* — Binh Tat
(74) *Attorney, Agent, or Firm* — Edwards Wildman Palmer LLP; Peter F. Corless; Steven M. Jensen (57) ABSTRACT

A method for synthesizing a clock-tree structure may be applied to a physical design such as an integrated circuit or a printed circuit board to form a symmetrical clock-tree structure, while achieving the effects including minimizing a clock skew, having a process variation tolerance and increasing the synthesizing rate. To prevent a certain level from having too many branches and ensure that the clock-tree structure satisfies the fan-out constraint, a plurality of pseudo sinks are provided such that the result of factorizing the value of the number of the total sinks may satisfy the fan-out constraint. The levels in the clock-tree structure may have equal branch lengths by employing snaking routing, so as to achieve a symmetrical clock-tree structure design and reduce the clock skew of the clock-tree.

7 Claims, 8 Drawing Sheets

CLOCK-TREE STRUCTURE AND METHOD FOR SYNTHESIZING THE SAME

CROSS-REFERENCES TO RELATED APPLICATIONS

This application claims under 35 U.S.C. §119(a) the benefit of Taiwanese Application No. 99136896, filed Oct. 28, 2010, the entire contents of which is incorporated herein by reference.

BACKGROUND OF THE INVENTION

1. Field of the Invention

This invention relates to clock-tree structures and methods for synthesizing the clock-tree structure, and, more particularly, to a symmetrical clock-tree structure that has a minimized clock skew and enhanced process-variation tolerance, and a method for synthesizing the clock-tree structure.

2. Description of Related Art

With the rapid growth of complexity in current chip design, modern circuit systems mainly employ a synchronization system design. In the synchronization system, element blocks or subsystems in an integrated circuit or a printed circuit board have to operate at a consistent clock to meet the synchronous requirement. In practice, a clock source is installed to be in charge of generating a clock signal commonly used by the blocks or subsystems. However, since distances from the clock source to the blocks or subsystems differ from one another, the clock used by blocks or subsystems suffers some errors, which are called clock skew.

In a high-speed chip synchronous system, a clock tree that has less clock skew may effectively improve the clock speed. With the progress of manufacturing processes, process variation may affect the clock tree significantly, which causes the optimization of clock skew more difficult. According to the prior art, the majority of clock tree synthesizing techniques rely on timing models to estimate clock skew. The accuracy and complexity of the timing model dominates the quality and efficiency of the clock tree synthesis techniques. In general, a model having a higher accuracy may obtain less clock skew, in the cost of longer synthesizing time. Furthermore, modern timing models are not qualified to address the high accuracy required in high-speed chips. Inevitably, simulation techniques thus come to the market to estimate clock skew. However, the simulation techniques may cause a clock tree to take up to a couple of hours to be synthesized completely, which severely affects the convergence time of a whole chip design flow.

A dilemma of getting high accuracy or obtaining high efficiency always exists in synthesizing a clock tree. In particular, if process variation is further taken into consideration, it is even more difficult to optimize a clock-tree structure. The simulation techniques, though obtaining accurate timing information, may unnecessarily extend the synthesizing time. On the contrary, a compact timing model may speed up synthesizing, but cause the synthesized clock to suffer severe clock skew.

Therefore, how to provide a clock-tree structure and a method for synthesizing the clock-tree structure to solve the problems of the prior art is becoming one of the most urgent issues in the art.

SUMMARY OF THE INVENTION

In view of the above-mentioned problems of the prior art, it is a primary objective of the present invention to improve the accuracy of synchronous clock signals, in order to make a clock tree to have an optimized structure and a sufficient small clock skew, without suffering errors caused by using timing models.

It is another objective of the present invention to speed up synthesizing a clock-tree structure, without the need of using simulation techniques to establish a symmetrical structure. The symmetrical clock-tree structure may be synthesized faster than other clock-tree structures that are synthesized by simulation techniques.

It is a further objective of the present invention to improve the tolerance of a clock-tree structure with respect to process variation. Through the use of a symmetrical arrangement, the clock-tree structure has less clock skew affected by the process variation.

To achieve the above-mentioned and other objectives, a method for synthesizing a clock-tree structure is provided according to the present invention. The method is applied to a physical design of an integrated circuit to form a symmetrical clock-tree structure. In the structure, the clock source is routed to a plurality of sinks according to a predetermined fan-out constraint that is a maximum fan-out number of each node of the clock-tree structure. The method includes following three major steps. (1) First, a plurality of pseudo sinks is provided on an integrated circuit, and the sinks and the pseudo sinks are defined as a total sink set. Also, the number of the sinks in the total sink set is defined as a total sink number, such that (N−1) factors obtained by factorizing the value of the total sink number are less than or equal to the fan-out constraint. (2) A number of levels of the clock-tree structure is set to N, and the factors are individually assigned to corresponding levels except an Nth level. By this, each of the levels can have a node number equal to a total branch number of a previous level to the each level, and each node of the each level can have a branch number equal to the factor corresponding to the each level, wherein a first level has one node. (3) The location and corresponding branch length of each node of the each level is determined, so that each node of the each level is connected via the plurality of branches to a plurality of corresponding nodes in a next level, where the branch number is determined in step (2). Moreover, the nodes of the each level have equal branch lengths. Note that the clock source is connected to the node of the first level, and the sinks in the total sink set are defined as nodes of the Nth level.

In an embodiment of the present invention, step (3) further includes following 7 steps. (3-1) The total sink set are divided (N−2) times sequentially into a plurality of clusters according to the factors corresponding to the first level to the (N−1)th level, such that a number of clusters corresponding to the each level is equal to a total branch number of the each level, and all clusters of each level have equal sinks. In the resulting clusters of the each level, a longest cluster diameter is minimized, wherein the cluster diameter is a longest Manhattan distance among sinks contained in a cluster. (3-2) A half of a longest cluster diameter among all clusters corresponding to the (N−1)th level is defined to be a common connection length of the (N−1)th level. The common connection length of the (N−1)th level is defined to be a tilted rectangular region (TRR) extension radius, such that a TRR extension is performed on each sink in each cluster of the (N−1)th level, and each sink in each cluster of the (N−1)th level has a corresponding extended TRR. (3-3) Each intersection region of all extended TRRs in each cluster of the (N−1)th level is defined to be a node region of the (N−1)th level. Accordingly, a number of the node regions of the (N−1)th level is equal to a node number of the (N−1)th level, wherein each node region indicates a potential embedding region of one of the nodes.

(3-4) The plurality of node regions of the (N−1)th level are re-divided (N−3) times sequentially into a plurality of clusters according to the factors corresponding to the first level to the (N−2)th level, such that a number of clusters corresponding to the first level to the (N−2)th level is equal to a total branch number of the each level, and all clusters corresponding to the first level to the (N−2)th level have equal number of node regions. In the resulting clusters of the each level from the first level to the (N−2)th level, a longest cluster diameter shall be minimized. (3-5) A half of a longest cluster diameter in all clusters of the (N−2)th level is defined to be a common connection length of the (N−2)th level, and the common connection length of the (N−2)th level is defined to be a TRR extension radius, such that the TRR extension is performed on each node region contained in each of to the (N−2)th level, and each node region in each cluster of the (N−2)th level has a corresponding extended TRR. (3-6) Each intersection region of all extended TRRs in each cluster of the (N−2)th level is defined to be a node region of the (N−2th level. Accordingly, a number of the node region of the (N−2)th level is equal to a node number of the (N−2)th level. (3-7) Steps (3-4) to (3-6) are iterated, such that node regions corresponding to each of the levels are sequentially obtained, and a position of each node of the each level and a branch length corresponding to each node are embedded according to the node regions.

In an embodiment of the present invention, a snaking routing is employed to cause nodes in the each level to be connected to corresponding nodes in a next level through a plurality of branches of equal lengths.

In an embodiment of the present invention, the method further comprises the step of inserting buffers on all branches of each node in the each level, wherein connection lengths between each node and the buffers on the branches of the node are equal, and the buffers inserted on the branches of the nodes in the same level are completely the same.

The present invention provides a clock-tree structure, wherein a clock routing is performed symmetrically. The clock-tree structure includes: a plurality of levels, each of which has a plurality of nodes, wherein each of the nodes has an equal number of branches and is connected via the branches to nodes of a next level. In each of the levels, a sum of numbers of branches of all nodes is equal to a total branch number, and a number of nodes is equal to a total branch number of a previous level. Also, nodes in each of the levels have equal branch lengths. The clock-tree structure also includes a plurality of sinks, and each of which defines nodes of the last one of the plurality of levels.

Compared with the prior art, the clock-tree structure and the method for synthesizing the same according to the embodiments of the present invention can avoid the accuracy errors caused by using timing models, improve the accuracy of synchronous clock signals, obtain a small clock skew, get an execution speed higher than that of a synthesizing method uses simulation techniques, and reduce the clock skew caused by the process variation through the symmetrical arrangement.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The present invention solves the dilemma of enhancing efficiency or improving accuracy. A clock tree is established to have a symmetrical structure, in which nodes in the same level have approximately the same number of branches, routing lengths and inserted buffers. Accordingly, paths from a clock source to synchronous elements (sinks) have similar arrangement. Therefore, a clock skew is reduced naturally, without the need of using simulation techniques or referring to timing models. The symmetrical clock-tree structure has an enhanced process variation tolerance. Accordingly, the clock skew is less affected by the variation, and the yield is increased. In short, the symmetrical clock-tree structure may optimize the clock skew, overcome the process variation, and have an increased yield.

Branch Number Process

Figure 1A:
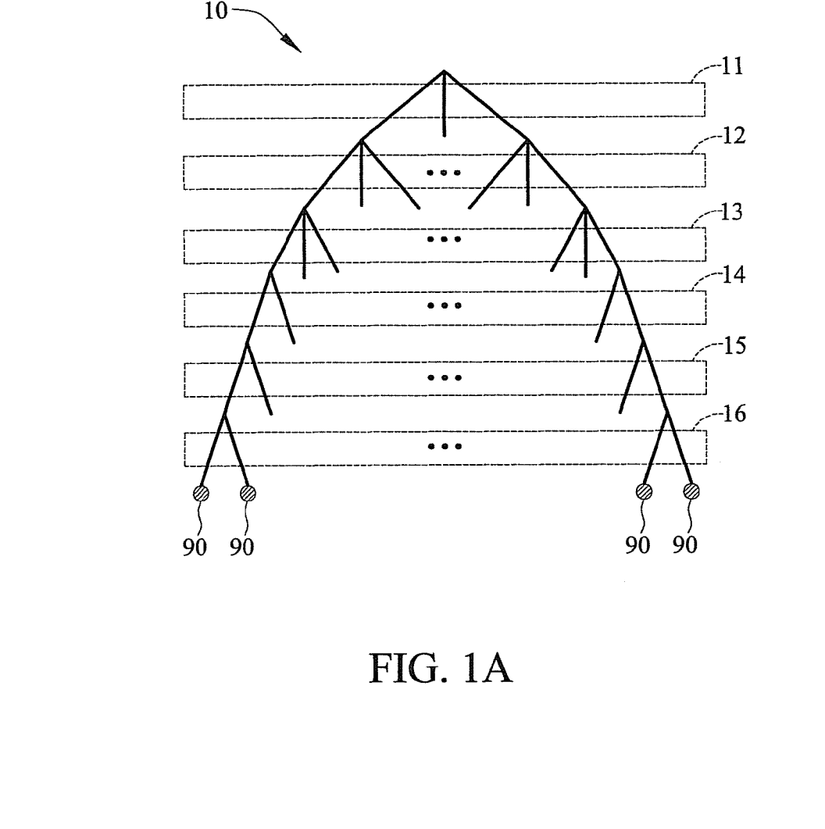
FIGS. 1A and 1B are schematic diagrams of a method, according to an embodiment of the present invention, for synthesizing a clock-tree structure, the method applied to different numbers of sinks.
Figure 1B:
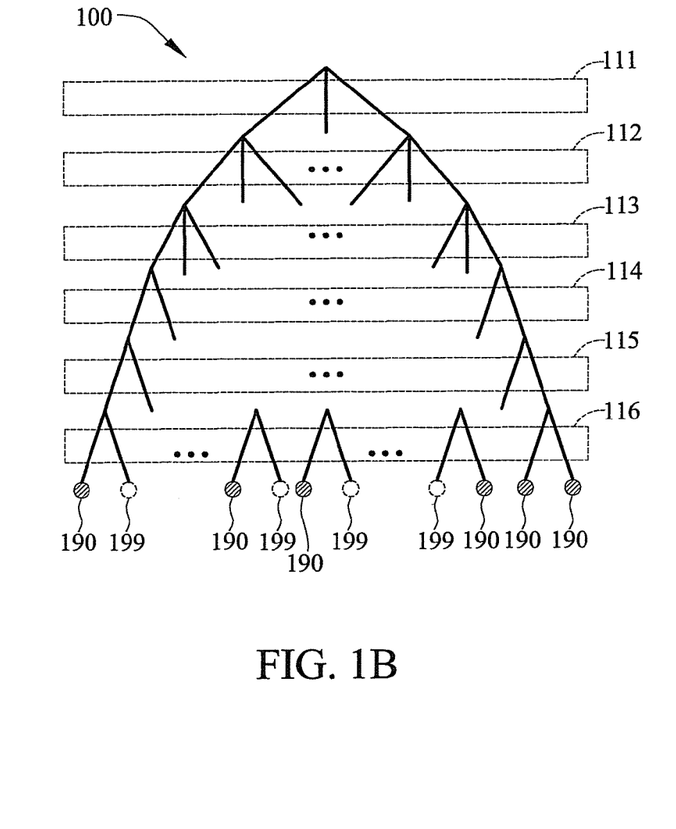

FIGS. 1A and 1B are schematic diagrams of a method for synthesizing a clock-tree structure, which the method is applied to different numbers of sinks. As shown in FIG. 1A, a clock-tree structure 10 has 216 sinks 90. The clock-tree structure 10 has a branch-number plan (BNP) that is designed in non-increasing order represented by BNP=B(216)=<$b_1$,$b_2$, $b_3$,$b_4$,$b_5$,$b_6$>=<3,3,3,2,2,2>, where $b_1$ represents a branch number in a first level 11 of the clock-tree structure 10, $b_2$ a branch number of each node in a second level 12 of the clock-tree structure 10, $b_3$ a branch number of each node in a third level 13 of the clock-tree structure 10, $b_4$ a branch number of each node in a fourth level 14 of the clock-tree structure 10, $b_5$ a branch number of each node in a fifth level 15 of the clock-tree structure 10, and $b_6$ a branch number of each node in a sixth level 16 of the clock-tree structure 10. All of the branch numbers comply with a general fan-out constraint. The fan-out constraint indicates a maximum fan-out number that nodes in the clock-tree structure 10 may accept. In practice, the fan-out constraint corresponds to a maximum current or circuit driving capability provided by buffers that is given in a circuit process, and varies with different process specifications.

For instance, if there are 212 sinks (assumed that the fan-out constraint provided by buffers is 32 in a given circuit process), the branch-number plan is designed to be $B(212)=<b_1,b_2,b_3>=<53,2,2>$, with the symmetrical structure consideration. It is apparent that the first level has as many as 53 branches, which is far greater than the fan-out constraint given by the circuit process specification.

In order to solve the problem that the number of sinks does not satisfy the fan-out constraint, with the symmetrical structure consideration, a clock-tree structure synthesizing method of present invention comprises providing on an integrated circuit a plurality of pseudo sinks. Based on defining the sinks and the pseudo sinks as a total sink set, the value of a total number of sinks contained in the total sink set is factorized into N factors that are all less than or equal to the fan-out constraint.

As shown in FIG. 1B, four pseudo sinks 199 are provided on the integrated circuit, such that the 212 sinks 199 and the four pseudo sinks 199 are defined as the total sink set, which has the value of a total number of the sinks equal to 212+4=216. The value of the total number of the sinks is then factorized, so as to cause a branch-number plan of the clock-tree structure 100 to be the same as the branch-tree plan of the clock-tree structure 10. In the clock-tree structure 100, the branch numbers of nodes of the levels level 111, 112, 113, 114, 115 and 116 satisfy a fan-out constraint of the clock-tree structure 100.

Note that although it is the four additional pseudo sinks 199 provided on the integrated circuit that cause the branch-number plan of the clock-tree structure 100 to be satisfied with the fan-out constraint, the number of additional pseudo sinks is not limited. In an embodiment of the present invention, any number of pseudo sinks may be provided on the integrated circuit. For instance, users are allowed to provide y pseudo sinks on the integrated circuit according to their demands or any fan-out constraint, as long as $B(212+y)=<b_1,b_2,\ldots,bm>$, and $b_1,b_2,\ldots$, and bm satisfy the fan-out constraint.

The pseudo sinks provided in the method according to the present invention may be deemed as dummy elements. The dummy elements may be placed at any position of the integrated circuit or a printed circuit board, according to users' demands, to provide the users with a flexible design choice for the clock-tree structure.

Routing Length Design

Figure 2A:
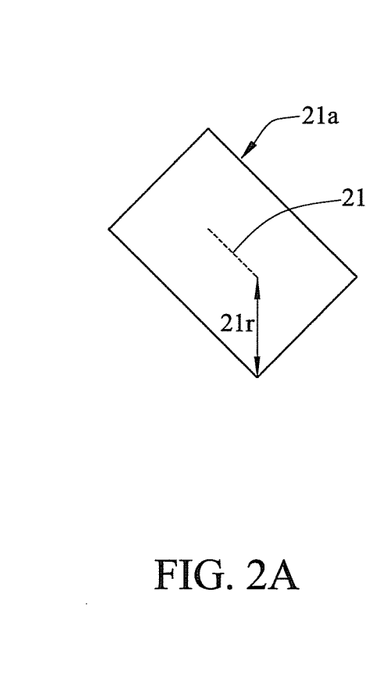
FIG. 2A depicts a structure of a TRR of a sink or a clock-tree node.
Figure 2B:
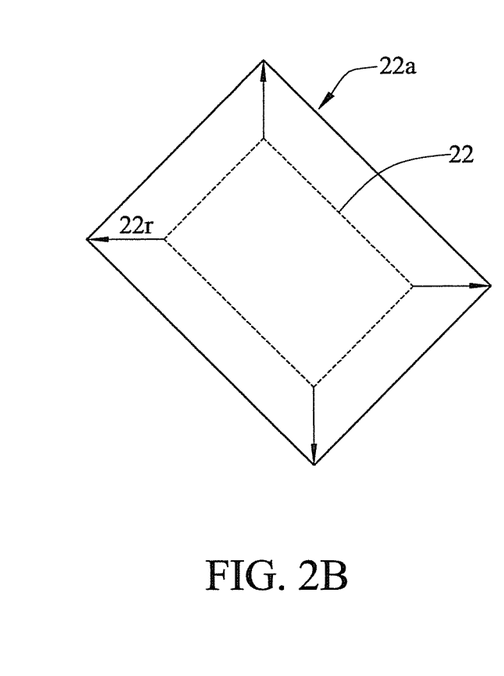
FIG. 2B defines an extended TRR obtained by extending a TRR of a sink or a clock-tree node.
Figure 2C:
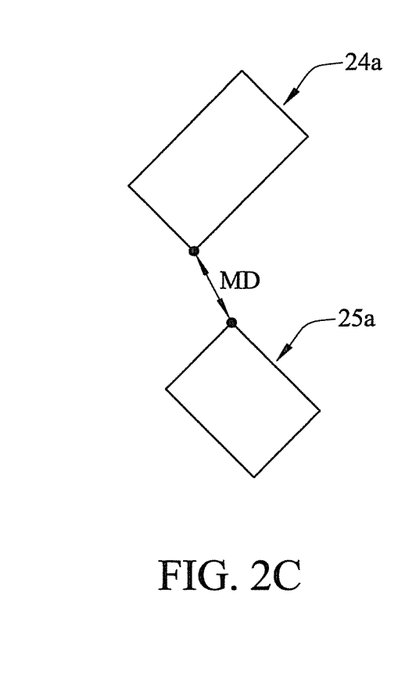
FIG. 2C defines a Manhattan distance between two TRRs.

FIG. 2A depicts a TRR 21a of a sink or a node of a clock tree. FIG. 2B defines an extended TRR 22a obtained by extending a TRR 22 of a sink or a node of a clock tree. FIG. 2C defines a Manhattan distance between two rectangular region 24a and 25a. As shown in FIG. 2A, the TRR 21a represents a region which can be reached from the TRR core 21 with extension radius 21r. As shown in FIG. 2B, the extended TRR 22a can be obtained by extending four corners of the TRR 22 in horizontal and vertical directions. The Manhattan distance between the two TRRs 24a and 25a are defined as a Manhattan distance between two closest points in the two regions as shown in FIG. 2C. Note that a TRR has a core and a radius, wherein the core is a segment, the radius is a length, and both are measured with respect to a Manhattan distance.

Figure 3A:
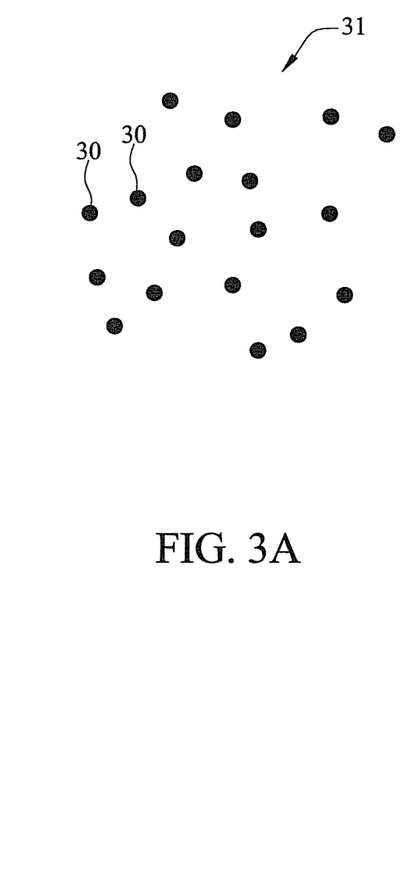
FIGS. 3A to 3F are schematic diagrams illustrating that a method according to an embodiment of the present invention divides a total sink set into a plurality of clusters according to factors of each level.

FIGS. 3A to 3F are schematic diagrams illustrating that a method of the present invention divides a total sink set 31 into a plurality of clusters 33a, 33b, 33c, 35a, 35b, 35c, 37a, 37b and 37c according to factors corresponding to each level sequentially. As shown in FIG. 3A, the total sink set 31 has 18 sinks 30. A method according to the present invention designs a branch-number plan of the total sink set 31 to be $B(18)=<b_1,b_2,b_3>=<3,3,2>$. Then, the 18 sinks 30 are divided by a recursive cake-cutting method, as shown in FIGS. 3B to 3F.

Figure 3B:
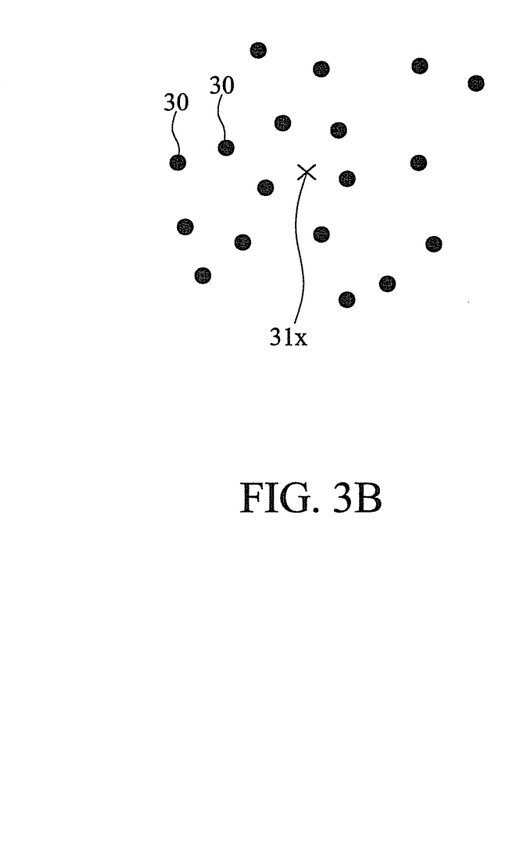
Figure 3C:
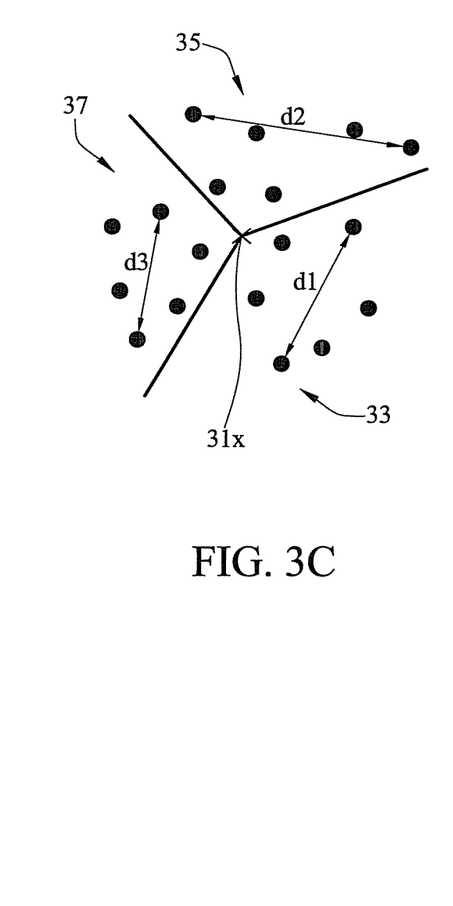

As shown in FIGS. 3B and 3C, a division center, i.e., a geometric center, 31x is provided in the total sink set 31. Then, the sinks 30 are divided into $b_1$ clusters 33, 35 and 37 (i.e., three clusters) according to polar angles with respect to the division center of all sinks, where a longest cluster diameter among respective cluster diameter $d_1$, $d_2$ and $d_3$ of the clusters 33, 35 and 37 is the shortest.

Figure 3D:
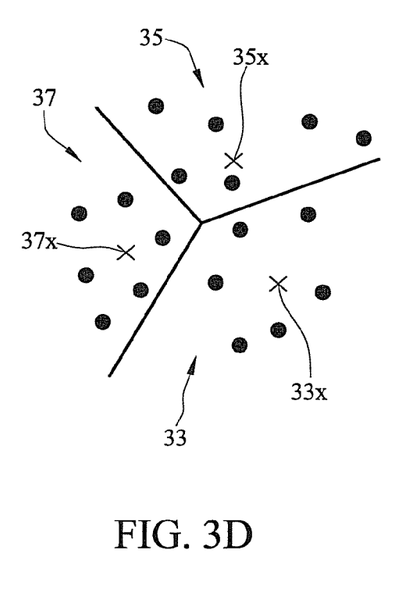
Figure 3E:
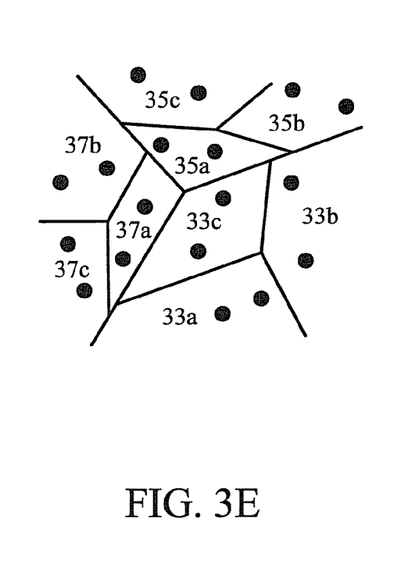
Figure 3F:
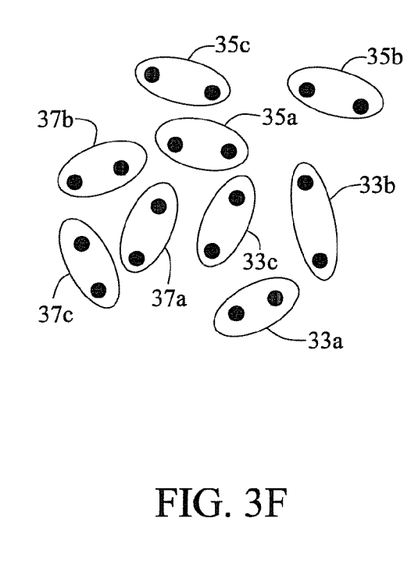

As shown in FIGS. 3D to 3F, division centers 33x, 35x and 37x are provided in the clusters 33, 35 and 37, respectively. Sinks respectively contained in the clusters 33, 35 and 37 are divided into $b_2$ clusters 33a, 33b and 33c (i.e., three clusters), 35a, 35b, and 35c (i.e., three clusters), and 37a, 37b and 37c (i.e., three clusters) according to polar angles with the division center, where a longest cluster diameter among the cluster diameters of the clusters 33a, 33b, 33c, 35a, 35b, 35c, 37a, 37b and 37c is the shortest.

As shown in FIG. 3F, $b_1 \times b_2$ clusters 33a, 33b, 33c, 35a, 35b, 35c, 37a, 37b and 37c are obtained through the above dividing process, and the clusters all have $b_3$ sinks (i.e., two sinks), where a longest cluster diameter among the cluster diameters of the clusters is the shortest. Note that the sinks or node regions are divided by the recursive cake-cutting method in the embodiment. However, other methods, such as a minimum-bottleneck maximum matching method and an integer-linear-programming grouping method, may also be used to divide the sinks according to users' demands.

Figure 4A:
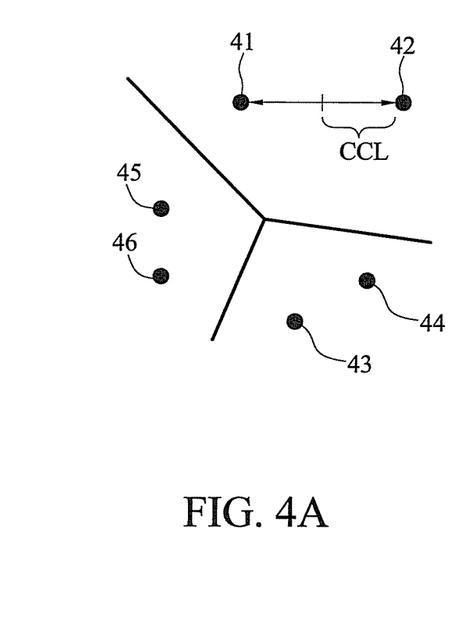
FIG. 4A to 4C are schematic diagrams illustrating that a method according to an embodiment of the present invention performs a TRR extension on each sink of the clusters to obtain each node region.
Figure 4B:
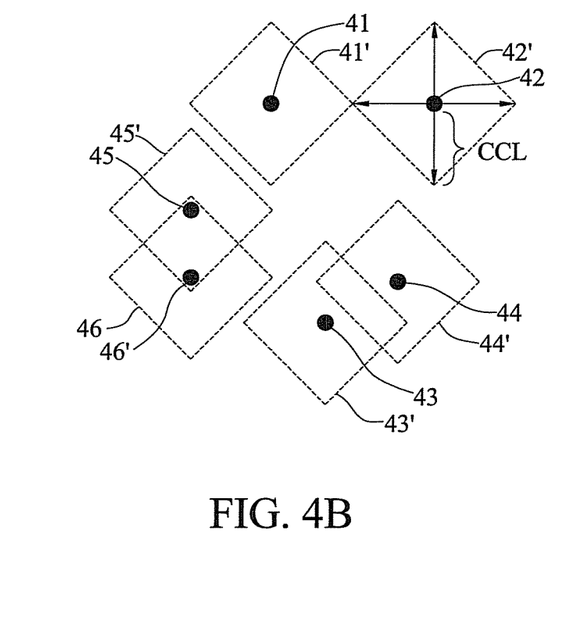
Figure 4C:
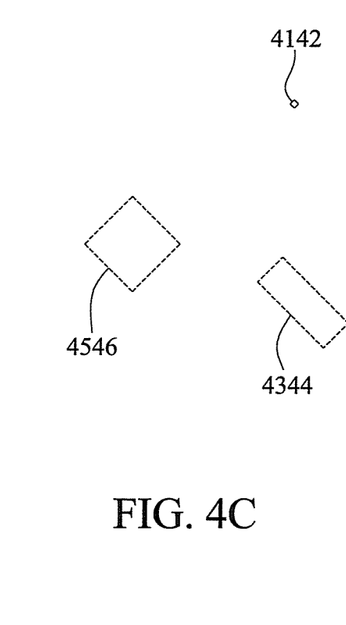

FIG. 4A to 4C are schematic diagrams illustrating that a method of the present invention performs a TRR extension on each sink of the clusters to obtain each node region. In the embodiment, the branch-number plan of a total of six sinks is designed to be $B(6)=<b_1,b_2>=<3,2>$, which implies a generated clock tree has three levels (N=3). As shown in FIG. 4A, each of $b_1$ clusters (i.e., three clusters), which is generated by dividing in a second level, has $b_2$ sinks (i.e., two sinks). The cluster, which contains sinks 41 and 42, has a longest cluster diameter among the three clusters. A half of the longest cluster diameter is defined to be a common connection length (CCL) of the second level. With the common connection length of the second level as a TRR extension radius of the second level, a TRR extension process is performed on the sinks 41, 42, 43, 44, 45 and 46 of each cluster of the second level, such that each sink in each cluster of the second level has a corresponding extended TRR. Note that in an integrated circuit physical design, all extended TRRs are extended in vertical and horizontal directions, and edges of extended TRRs have 45 or 135 degrees of orientation.

As shown in FIG. 4B, the sink 41 corresponds to an extended TRR 41', the sink 42 corresponds to an extended TRR 42', the sink 43 corresponds to an extended TRR 43', the sink 44 corresponds to an extended TRR 44', the sink 45 corresponds to an extended TRR 45', and the sink 46 corresponds to an extended TRR 46'. An intersection region formed by the extension region 41' and the extension region 42' is a node region 4142, an intersection region formed by the extension region 43' and the extension region 44' is a node region 4344, and an intersection region formed by the extension region 45' and the extension region 46' is a node region 4546. Each of node regions 4142, 4344 and 4546 represents an embedding region of one of nodes of the second level, and only one node of the second level may be embedded in each node region. As shown in FIG. 4C, the node region 4142 where a node can be embedded is a point, and the regions 4344 and 4546 where nodes can be embedded are tilted rectangles. Note that the TRR of a single point consists of a zero-length core and a zero-length radius.

As described previously, the node regions of all nodes corresponding to the second level can be obtained by performing the TRR extension process on the sinks of each cluster of the second level. Likewise, a node region corresponding to the first level may be obtained by the same steps. First, a half of a longest Manhattan distance among all node regions of the second level is defined as the common connection length of the first level. Second, the TRR extension process is performed on the node regions 4142, 4344 and 4546 corresponding to the second level by taking the common connection length as the TRR extension radius of the first level. Finally, the extended node regions are intersected. Only one node of the first level can be embedded in the node region.

Figure 5A:
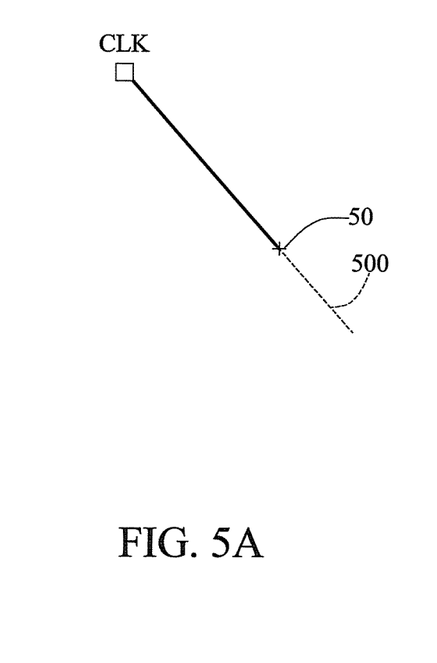
FIGS. 5A to 5C are schematic diagrams illustrating that a method according to an embodiment of the present invention determines a geometric location of each node of each level based on node regions corresponding to each level, and performs corresponding snaking routing to cause all branches of each node in each level to have equal lengths.
Figure 5B:
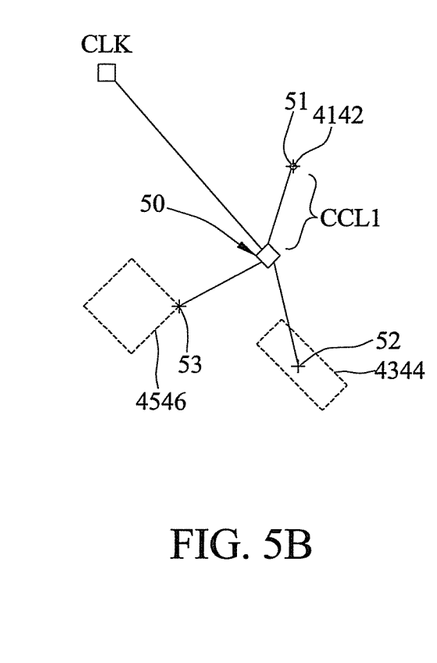
Figure 5C:
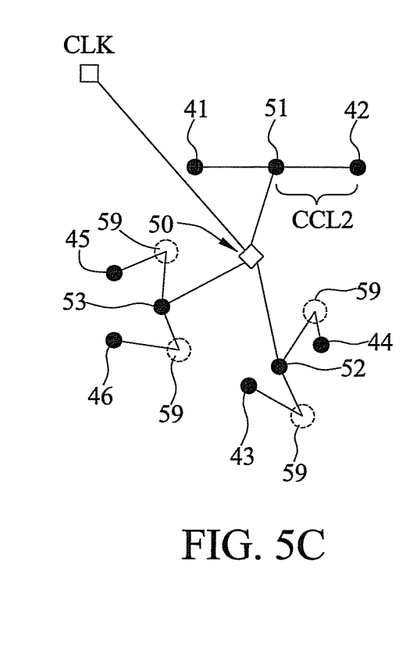

FIGS. 5A to 5C are schematic diagrams illustrating that a method of the present invention determines a geometric location of each node of each level according to node regions corresponding to each of the levels, and performs corresponding snaking routing to cause all branches of each node in each level to have equal lengths. As shown in FIG. 5, the TRR extension process can be performed on the node regions node region 4142, 4344 and 4546 shown in FIG. 4C, to obtain a node region 500 of the first level through an intersection process. The node region 500 corresponds to the node 50 of the first level. Since the node region corresponding to the first level is the node region 500 (which consists of a non-zero-length core and a zero-length radius) shown in FIG. 5A, a location that is closest to the clock source CLK has to be selected to embed the node 50 corresponding to the first level, and the node 50 is connected to the clock source CLK directly.

Since the node 50 is obtained by intersecting the extended node regions obtained by performing the TRR extension process on the node regions 4142, 4344 and 4546 corresponding to the second level, and all branches of the same level must have equal lengths, the node 50 can be connected to the node regions 4142, 4344 and 4546 of the second level, with the common connection length CCL1 of the first level (shown in FIG. 5B).

As shown in FIG. 5C, the node 50 is connected to the node 51 (i.e., the node region 4142), the node 52 (contained in the node region 4344) and the node 53 (contained in the node region 4546), with the common connection length CCL1. Note that although FIG. 5C shows that the node 50 is connected to the nodes 51, 52 and 53, with a "straight line," a snaking routing 59 (a "non-straight line") may also be employed to connect the node 50 to the nodes node 51, 52 and 53. For instance, nodes 51, 52 and 53 are all nodes corresponding to the second level, so the nodes can be connected to the corresponding sinks 41 and 42, 43 and 44, and 45 and 46, respectively, with the common connection length CCL2 of the second level. It order for the all branches of the same level to have equal lengths, the node 52 may be connected to the sinks 43 and 44 by the snaking routing 59, and the node 53 may also be connected to the sinks 45 and 46 by the snaking routing 59.

As described previously, the method of the present invention shown in FIGS. 5A to 5C makes each node corresponding to each of the levels to be connected to nodes or sinks corresponding to a next level with the same connection length. Therefore, the clock-tree structure may have an optimized structure, and a symmetrical structure in view of any node.

Symmetrical Buffer Insertion

Figure 6A:
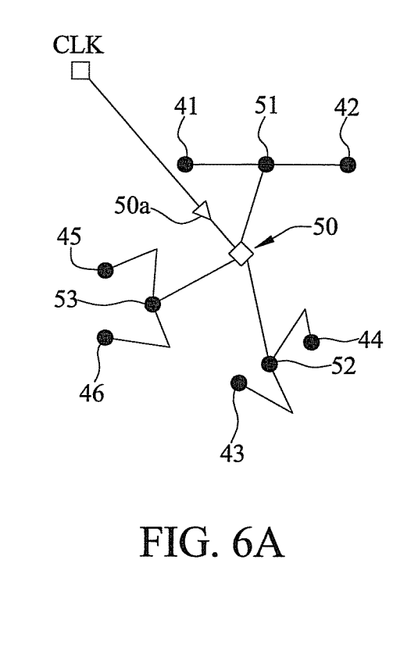
FIGS. 6A to 6C are schematic diagrams illustrating that a method according to an embodiment of the present invention inserts buffers from a clock source along all branches of each node in each level.
Figure 6B:
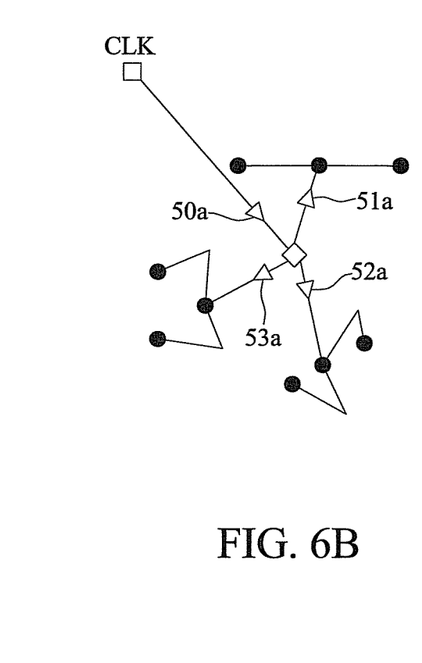
Figure 6C:
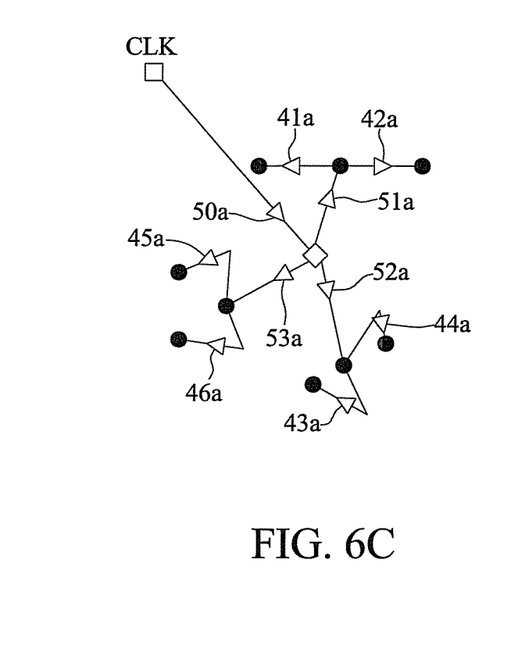

In order to ensure that the symmetrical clock-tree structure is drivable, a method for synthesizing a clock-tree structure of the present invention provides a symmetrical buffer insertion method. Buffers are inserted on all branches of each node of each level, and the buffers that are inserted on the branches of the nodes of the same level are the same. As shown in FIG. 6A, a buffer 50a may be inserted on a connection path between the clock source CLK and the node 50. As shown in FIG. 6B, three completely identical buffers 51a, 52a and 53a are inserted on paths that connect the node 50 to the nodes 51, 52 and 53, respectively, where the distances between the node 50 and the buffers 51a, 52a and 53a are equal. Therefore, a symmetrical configuration in terms of buffering and routing can be formed between the node 50 and the nodes 51, 52 and 53. As shown in FIG. 6C, buffers 41a and 42a, 43a and 44a, and 45a and 46a are inserted on branches of the nodes 51, 52 and 53 corresponding to the second level, respectively. In order to achieve a symmetrical structure, the buffers 41a, 42a, 43a, 44a, 45a, and 46a are the same buffers, the connection lengths between the node 51 and the buffer 41a and 42a are equal, the connection lengths between the node 52 and the buffer 43a and 44a are equal, and the connection lengths between the node 53 and the buffer 45a and 46a are equal.

In other embodiments of the present invention, some of the sinks may be replaced by pseudo sinks, and the pseudo sinks may be deemed as dummy elements, which may be placed at any position in an integrated circuit or a printed circuit board layout according to users' demands. Since pseudo sinks are dummy elements, no specific limitation is imposed on the TRR of the pseudo sinks. Accordingly, users may define the TRR of each pseudo sink to include all chip area, or define the pseudo sink to have no TRR. In performing an optimizing process on the cluster diameters among the clusters, the pseudo sinks may be ignored. If the pseudo sinks are ignored, one cluster may be allowed to differ from another cluster by at most one sink, and the cluster that has fewer sinks has to be inserted with pseudo sinks for further routing. When determining the node positions and routing, the TRR of the pseudo sinks may be set to include the whole chip area. Therefore, a dangling routing needed by the pseudo sinks can be automatically routed during the same routing process.

Also, the buffers that are inserted on branches connected to the pseudo sinks may be arranged according to users' demands. For example, in order to achieve the balance of fan-out loading among nodes, the branches connected to the pseudo sinks are provided the same buffers as those inserted on branches connected to the sinks. The pseudo sinks may be deemed as dummy elements, and are connected to wires of the buffers. Therefore, a flexibility is provided for users to select a clock-tree structure design.

Figure 7:
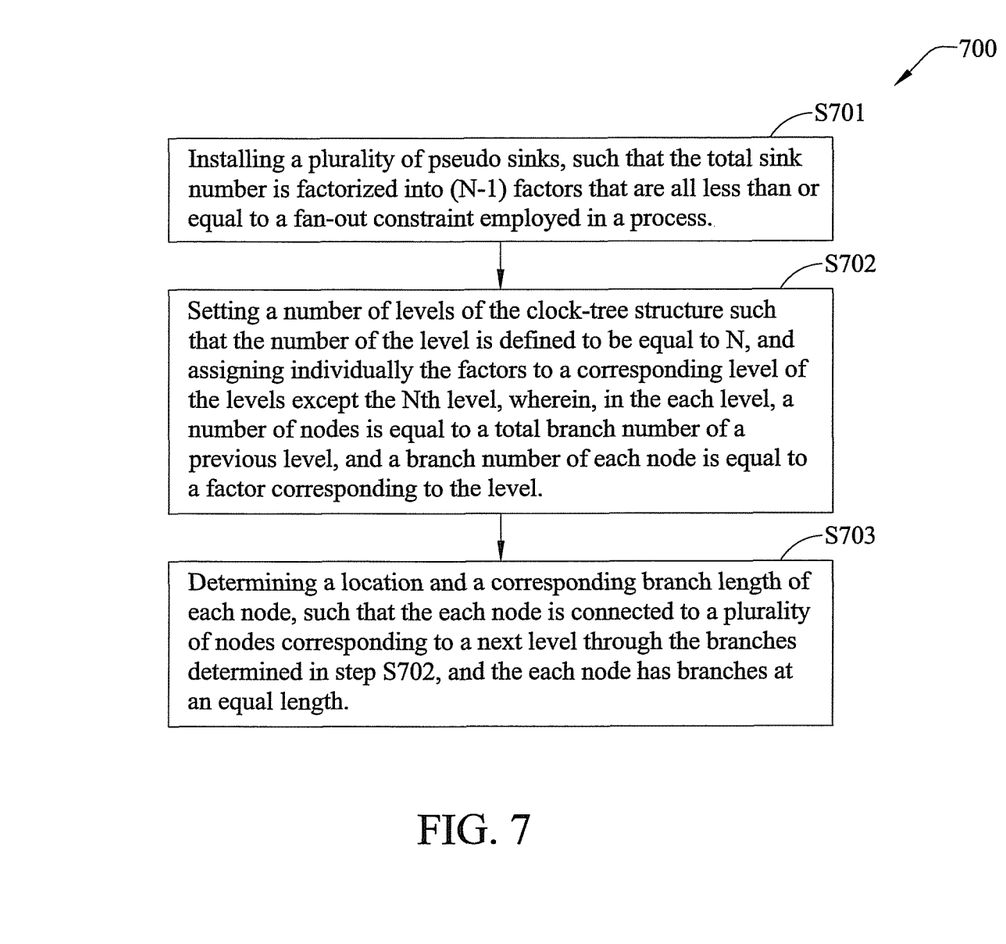
FIG. 7 is a flow chart of a method according to an embodiment of the present invention that generates a symmetrical clock-tree structure.

FIG. 7 is a flow chart of a method 700 that generates a symmetrical clock-tree structure. In step S701, a plurality of pseudo sinks are installed, and the sink and the pseudo sinks are defined as a total sink set. Also, a total number of sinks in the total sink set is defined as a total sink number, such that the total sink number is factorized into (N−1) factors that are all less than or equal to a fan-out constraint employed in a process. Proceed to step S702.

In step S702, a number of levels of the clock-tree structure is set, such that the number of the levels is defined to be equal to N. Also, the factors are individually assigned to a corresponding level of the levels except the Nth level, wherein, in the each level, a number of nodes is equal to a total branch number of a previous level, and a branch number of each node is equal to a factor corresponding to the level. Proceed to step S703.

In step S703, in the each level, a location and a corresponding branch length of each node is determined, such that the each node is connected to a plurality of nodes corresponding to a next level through the branches determined in step S702, and the each node has branches at an equal length.

In addition, in step S703 the method 700 further comprises the following steps. The total sink set are divided (N−2) times sequentially into a plurality of clusters according to the factors corresponding to the first level to the (N−1)th level, such that a number of clusters of the each level t is equal to a branch number of the each level, and all clusters of the each level have equal sinks. As a result, in the each level a longest cluster diameter of the clusters is minimized. The common connection length of the (N−1)th level is then defined to be a TRR extension radius of the (N−1)th level, such that a TRR extension on each sink of each cluster of the (N−1)th level, and each sink in each cluster of the (N−1)th level has a corresponding extended TRR. Each intersection region of all extended TRRs in each cluster of the (N−1)th level is defined to be a node region of the (N−1)th level. Accordingly, a number of the node regions of the (N−1)th level is equal to a node number of the (N−1)th level, wherein each node region indicates a potential embedding region of one of the nodes. Further, the plurality of node regions of the(N−1)th level are re-divided (N−3) times sequentially into a plurality of clusters according to the factors corresponding to the first level to the (N−2)th level, such that a number of clusters corresponding to the first level to the (N−2)th level is equal to a total branch number of the each level, and all clusters corresponding to the first level to the (N−2)th level have equal node regions. In the resulting clusters of each of the levels from the first level to the (N−2)th level, a longest cluster diameter is minimized. Next, a half of a longest cluster diameter in all clusters of the (N−2)th level is defined to be a common connection length of the (N−2)th level, and the common connection length of the (N−2)th level is defined to be a TRR extension radius, such that the TRR extension is performed on each node region contained in each cluster of the (N−2)th level, with the common connection length of the (N−2)th level as the TRR extension radius, and each node region in each cluster of the (N−2)th level has a corresponding extended TRR. Afterwards, each intersection region of all extended TRR in each cluster of the (N−2)th level is defined to be a node region of the (N−2)th level. Accordingly, a number of node region of the (N−2)th level is equal to a node number of the (N−2)th level; and the above steps are iterated with respect to all node regions corresponding to the each level from the bottommost level, to obtain node regions corresponding to the each level sequentially, and a position of each node of the each level and a branch length corresponding to each node are embedded according to the node regions.

In conclusion, the method according to the embodiment of the present invention can form a clock tree having a symmetrical structure. An appropriate number of pseudo sinks are so installed that a branch number of each node of the each level of the clock tree may comply with a fan-out constraint, and the clock-tree structure has a symmetrical structure. For each level from the bottommost level on, node regions corresponding to a previous level is obtained according to the nodes regions of current level, and the symmetrical clock-tree structure is formed according to the obtained node regions corresponding to the each level. With regard to a clock-tree structure, except for that the node regions corresponding to the bottommost level are obtained according to the intersection of the TRR extensions of all sinks, the node regions of the remaining levels obtained by the intersection of the TRR extensions of the node regions contained in the clusters of the next level, the clusters being formed by dividing the node regions of the each level according to factors corresponding to the each level iteratively.

Compared with the prior art, a clock-tree structure and a method for synthesizing the clock-tree structure of the present invention may avoid the accuracy error caused by using timing models, improve the accuracy of synchronous clock signals, get an execution efficiency far greater than that of other synthesizing method uses simulation techniques, reduce clock skew through the use of a symmetrical arrangement, and improve the process variation tolerance.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A clock-tree structure applied to a physical design of an integrated circuit, a clock routing being performed symmetrically, the clock-tree structure comprising:
    a plurality of levels, each of which has a plurality of nodes, wherein each of the nodes has an equal number of branches and is connected via the branches to nodes of a next level by using snaking routing, a sum of numbers of branches of all nodes in each of the levels is equal to a total branch number of the each level, a number of nodes of the each level is equal to a total branch number of a previous level to the each level, and nodes in the each level have equal branch lengths;
    a plurality of sinks, each of which defines nodes of the last one of the plurality of levels, wherein each node in the each level has a branch number that is defined to be a branch number of each of the levels; and
    a plurality of buffers that are inserted on all branches of the each node in the each level, wherein connection lengths between the each node and the buffers on the branches of the node are equal, and the buffers on the branches in the same level are completely the same.

2. The clock-tree structure of claim 1, wherein the sinks are installed irregularly.

3. The clock-tree structure of claim 1, wherein the nodes of the each level are embedded irregularly.

4. The clock-tree structure of claim 1, wherein the each level has any amount of the branch number.

5. The clock-tree structure of claim 1, wherein at least one branch number of the levels has a different amount of branches from that of remaining of the levels.

6. The clock-tree structure of claim 1, wherein at least one branch number of the levels is other than 2.

7. The clock-tree structure of claim 1, wherein at least one branch number of the levels is other than 4.

* * * * *